United States Patent [19]
Chiang et al.

[11] Patent Number: 6,037,249
[45] Date of Patent: Mar. 14, 2000

[54] METHOD FOR FORMING AIR GAPS FOR ADVANCED INTERCONNECT SYSTEMS

[75] Inventors: Chien Chiang, Freemont; David B. Fraser, Danville; Vicky Ochoa, Pleasanton; Chuanbin Pan, Santa Clara; Sing-Mo H. Tzeng, San Jose, all of Calif.

[73] Assignee: Intel Corporation, Santa Clara, Calif.

[21] Appl. No.: 09/002,124

[22] Filed: Dec. 31, 1997

[51] Int. Cl.$^7$ ................................................ H01L 21/764
[52] U.S. Cl. ..................... 438/619; 438/623; 438/688; 438/761; 438/781; 438/790; 438/421
[58] Field of Search ..................................... 438/618, 619, 438/421, 422, 688, 623, 624, 761, 780–782, 787–790; 257/634, 635

[56] References Cited

U.S. PATENT DOCUMENTS

| | | | |
|---|---|---|---|
| 5,354,387 | 10/1994 | Lee et al. | 148/33.3 |
| 5,548,159 | 8/1996 | Jeng | 257/634 |

OTHER PUBLICATIONS

Wolf, "Silicon Processing for the VLSI Era", vol. 1, pp. 191–194,1989.

Primary Examiner—Charles Bowers
Assistant Examiner—Thanh Nguyen
Attorney, Agent, or Firm—Blakely, Sokoloff, Taylor & Zafman LLP

[57] ABSTRACT

A process for forming air gaps in an interconnect system is disclosed. At least two conductive lines are formed upon a substrate. A low-dielectric constant material (LDCM) is formed between the at least two conductive lines. Formation of the LDCM creates first and second adhesive forces between the LDCM and the at least two conductive lines and between the LDCM and the substrate, respectively. The LDCM is expanded. A dielectric layer is formed onto the LDCM and the at least two conductive lines. Formation of the dielectric layer creates a third adhesive force between the LDCM and the dielectric layer. The LDCM is contracted. Contraction of the LDCM resulting from a fourth force within the LDCM. Each of the first, second, and third adhesive forces are substantially stronger than the fourth force.

20 Claims, 5 Drawing Sheets

METHOD FOR FORMING AIR GAPS FOR ADVANCED INTERCONNECT SYSTEMS

BACKGROUND OF THE INVENTION

(1) Field of the Invention

The present invention generally relates to integrated circuits. More specifically, the present invention relates to a method for forming air gaps in an interconnect system of an integrated circuit.

(2) Description of the Related Art

Modern integrated circuits are generally made up of millions of active and passive devices such as transistors, capacitors, and resistors disposed onto a silicon wafer. These devices are initially isolated from one another, but are later interconnected together by an interconnect system to form functional circuits. The quality of the interconnection of these devices drastically affects the performance and reliability of the fabricated integrated circuit.

An interconnect system typically includes metal lines, spaced apart from each other, which interconnect the various active and passive devices found in a silicon wafer onto which the interconnect system has been deposited and fabricated. Insulating dielectric layers are deposited between the metal lines for isolating the metal lines from one another. Inherent in the structure of the interconnect system is a capacitance associated with the metal lines spaced apart from each other. Decreasing this capacitance is desirable as several advantages can be achieved therefrom, such as reduced RC delay, reduced power dissipation, and reduced cross-talk between the metal lines. Since the capacitance is inversely proportional with the distance between the metal lines, one way to reduce the capacitance between two lines would be to increase the space between the lines. However, this option is not desirable because of the limitations imposed by packing density.

One way to reduce the capacitance between two lines of an interconnect system is to reduce the dielectric constant of the dielectric material deposited between the metal lines, as the capacitance is directly proportional to the dielectric constant of the dielectric material between the metal lines. One dielectric material typically used to isolate metal lines from each other is silicon dioxide ($SiO_2$). Silicon dioxide is a thermally and chemically stable material. The dielectric constant of $SiO_2$ is approximately 4. The dielectric constant is based on a scale where 1.0 represents the dielectric constant of a vacuum. Various materials exhibit dielectric constants from approximately 1.0 to values in the hundreds.

The dielectric constant of $SiO_2$ is, however, high. Recent attempts have been made to use organic polymers that have low-densities and dielectric constants lower than those of silicon dioxide to replace silicon dioxide as a dielectric material thereby reducing the capacitance between the metal lines. Organic polymers are chemical compounds made up of repeating units that have high coefficient of thermal expansion (CTE) (typically around 60 ppm/° C.), which allows them to expand and shrink more rapidly than materials having lower CTEs. To reduce the dielectric constant of the organic polymer, recent attempts have focused on creating air gaps within the organic polymer. Since air has a dielectric constant of about 1, the use of air gaps between the metal lines reduces the dielectric constant of the polymer between the interconnect lines thereby reducing the overall interconnect system capacitance. However, conventional methods of forming air gaps, typically by non-conformal interlayer dielectric (ILD) deposition, may leave the voids vulnerable to chemical processes, such as etching or chemical polishing during fabrication of the interconnect system. Voids created by conventional methods are formed when the surfaces of two opposite sidewalls of a low-dielectric constant material meet centrally to close and fill a trench defined by two metal lines. Sometimes, however, reactant gas may have access through the seams and be trapped in the voids. Also, the voids may be left partially open during a chemical process step such that foreign materials may enter the voids. Trapped solvents create reliability problems during a high temperature process, such as chemical vapor deposition (CVD), since these solvents tend to evaporate thereby causing the formed void to explode.

What is needed is an improved method for forming air gaps in an interconnect system that avoids the reliability problems associated with conventional methods of forming air gaps.

BRIEF SUMMARY OF THE INVENTION

The present invention provides a process for forming air gaps in an interconnect system. At least two conductive lines are formed upon a substrate. A low-dielectric constant material (LDCM) is formed between the at least two conductive lines. Formation of the LDCM creates first and second adhesive forces between the LDCM and the at least two conductive lines and between the LDCM and the substrate, respectively. The LDCM is expanded. A dielectric layer is formed onto the LDCM and the at least two conductive lines. Formation of the dielectric layer creates a third adhesive force between the LDCM and the dielectric layer. The LDCM is contracted. Contraction of the LDCM resulting from a fourth force within the LDCM. Each of the first, second, and third adhesive forces are substantially stronger than the fourth force.

BRIEF DESCRIPTION OF THE DRAWINGS

The features, aspects, and advantages of the present invention will become more fully apparent from the following Detailed Description, appended claims, and accompanying drawings in which:

DETAILED DESCRIPTION OF THE INVENTION

In the following description, numerous specific details are set forth to provide a thorough understanding of the present invention. However, one having an ordinary skill in the art will recognize that the invention can be practiced without these specific details. In some instances, well-known circuits, structures and techniques have not been shown in detail to avoid unnecessarily obscuring the present invention.

Figure 1:
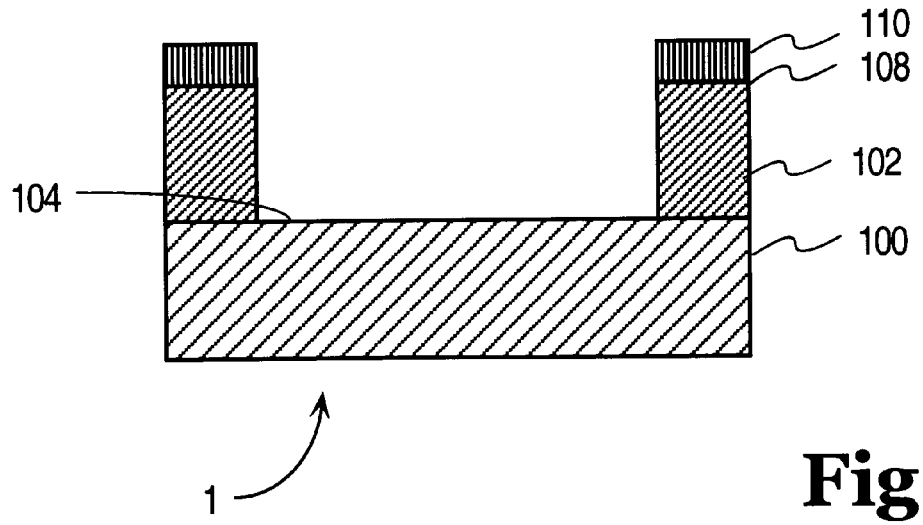
FIG. 1 shows a cross-sectional view of an interconnect system, according to one embodiment of the method of the present invention, with a dielectric layer formed upon a patterned metal layer of a substrate.

FIG. 1 shows a cross-sectional view of an interconnect system 1 that includes two metal lines 102, that may include aluminum or aluminum alloy, formed over a silicon substrate 100. The width of metal lines 102 varies depending on the integrated circuit being fabricated and is generally about 0.5 to 2 microns. Metal lines 102 are formed by patterning a metal layer deposited over substrate 100, using a well known process of photolithography and then performing an etching process to strip out the metal from the space between metal lines 102. A thin layer 110 of a first dielectric material is formed over a top surface 108 of metal lines 102. Layer 110 may be formed by a chemical vapor deposition process or other known processes of deposition by way of which one may deposit a relatively uniform film at a sufficiently low temperature to avoid flowing or melting of metal lines 102 and of other films that may possibly be formed on metal lines 102 before dielectric layer 110 is formed. Preferably, first dielectric layer 110 includes silicon dioxide or other dielectric having mechanical strength, thermal and insulating characteristics comparable to a second interlayer insulating or dielectric material 114 that will be explained later in this section. First dielectric layer 110 may have a thickness in the range of 300 to 5,000 angstroms.

Figure 2:
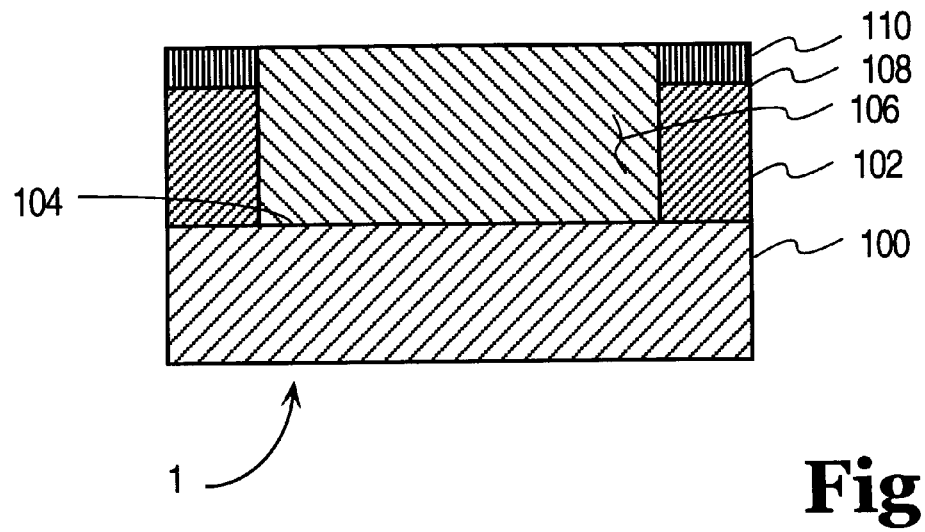
FIG. 2 shows a cross-sectional view of the interconnect system, according to one embodiment of the method of the present invention, where an organic polymer has been filled into a trench and planarized with a dielectric layer.

FIG. 2 shows a cross-sectional view of interconnect system 1 where trench 104, formed between metal lines 102, has been filled with a low dielectric constant insulating material 106 and thereafter planarized. For purposes of this invention, the term "trench" is to be construed broadly, and is not to be limited to an opening having parallel straight edges. Rather, "trench" can refer to any interstitial spacing, within metal lines 102, that is filled with trench insulating material 106. The placement of trench 104 as well as the dimensions are determined based on the circuit pattern for the metal lines and on the design of the integrated circuit device being fabricated. Generally, trench 104 may have a width of about 0.5 to 1.5 microns or smaller.

Trench insulating material 106 is a material having a relatively low dielectric constant that can withstand the temperatures of subsequent processing steps. The dielectric constant of insulating material 106 is preferably lower than that of silicon dioxide, to reduce the capacitance between metal lines 102. An example of such a material is a high temperature organic polymer such as polyarylether that has a dielectric constant of approximately 2.5. Other examples of such materials are silicon oxide glass, fluorinated silicon dioxide, hexagonal boron nitride, silicon carbide, foamed polymer, porous silicon dioxide, or high temperature aerogels. Hereinafter, trench insulating material 106 may sometimes be referred to as organic polymer.

Organic polymers generally have the unique properties of low glass transition temperature (100° C. to 400° C.), high coefficient of thermal expansion (CTE) (50 to 200 times greater than the CTE of $SiO_2$) and low modulus of elasticity (20 times lower than the modulus of elasticity of $SiO_2$). Depositing low dielectric constant materials such as organic polymers between metal lines 102 is one way to reduce the capacitance between the lines. To further reduce the interconnect system's capacitance, the embodiment of the present invention described herein provides a way of creating voids or porous foams in the organic polymer.

Organic polymer 106 may be filled into trench 104 by deposition using a known process such as chemical vapor deposition (CVD), preferably in a manner that fills trench 104 completely and over the top of metal lines 110. Another way of filing trench 104 may be by a typical spin on coating process where the top of metal lines 110 and trench 104 is coated by organic polymer 106. After organic polymer 106 is filled into trench 104, organic polymer is planarized by well known processes of chemical mechanical polishing (CMP) or etching back processes, for example.

Figure 3:
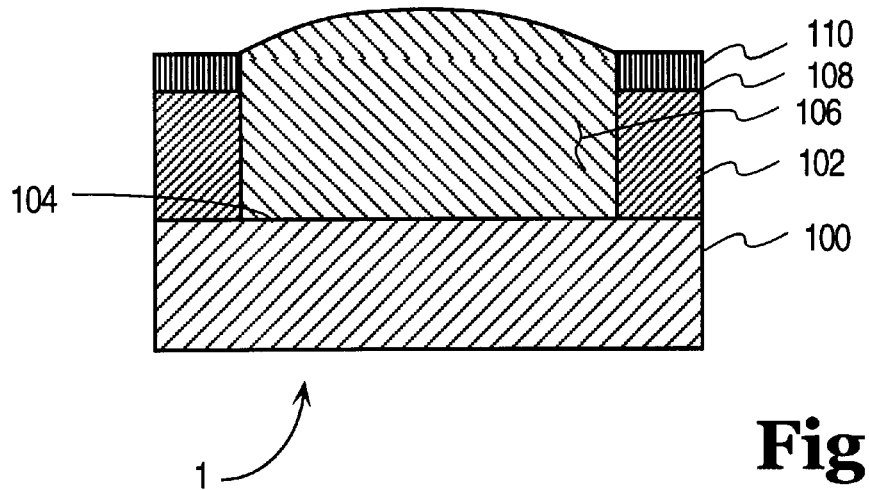
FIG. 3 shows a cross-sectional view of the interconnect system, according to one embodiment of the method of the present invention, after the interconnect system and organic polymer are heated.

FIG. 3 illustrates a cross section through interconnect system 1 after interconnect system 1 and organic polymer 106 are heated to a predetermined temperature which is the glass transition temperature ($T_g$) of organic polymer 106. Such glass transition temperature may be 400° C., for example. $T_g$ is the temperature at which a material's molecular bonds begin to weaken enough to cause a change in physical properties of the respective material. Depending on the type of organic polymer, the glass transition temperature can range from approximately 100° C. to 400° C. As organic polymer 106 and interconnect system 1 comprising substrate 100, aluminum lines 102, and first dielectric layer 110, including silicon dioxide, are brought to a $T_g$ of, for instance, 400° C., organic polymer 106 expands much more than the materials of the interconnect system surrounding the polymer. This is so as both aluminum and silicon dioxide have higher glass transition temperatures and lower coefficients of thermal expansion than organic polymer 106.

TABLE 1

| | Aluminum (Al) | Silicon Dioxide (SiO$_2$) | Polymer |
|---|---|---|---|
| Coefficient of Thermal Expansion (CTE) | 20 | 0.5 | 60 |
| Hardness (H) | 6 | 12 | 0.5 |
| Modulus of Elasticity (E) | 60 | 120 | 8 |

Table 1 illustrates various properties of organic polymers, of aluminum, and of silicon dioxide. The coefficient of thermal expansion (CTE) of a material defines the change in linear dimension per degree change in temperature. The organic polymer typically has a CTE of 60 while aluminum and silicon dioxide have CTEs of approximately 20 and 0.5, respectively. Due to the organic polymer's high CTE, the organic polymer 106 expands or shrinks much more than either aluminum or silicon dioxide per degree change in temperature. Thus, for a given $T_g$, the volume of organic polymer expands while the volumes of aluminum and silicon dioxide do not expand or expand (negligibly) in comparison to the expansion of the organic polymer 106. When the temperature at which the interconnect system is exposed is brought down to room temperature, the volume of the organic polymer contracts or shrinks while the volumes of aluminum and silicon dioxide do not contract, or contract negligibly, in comparison to the volume contraction of the organic polymer.

Table 1 further lists the hardness of an organic polymer, aluminum, and silicon dioxide. Hardness is defined as the measure of the resistance of a material to deformation. Both silicon dioxide and aluminum have a hardness number higher than the organic polymer and consequently, expand and contract less than the organic polymer.

Table 1 also lists the modulus of elasticity (E). The modulus of elasticity (E) is related to the hardness of a material. The modulus of elasticity defines the ratio of stress to strain in a material that is elastically deformed. The stress is the force producing or tending to produce deformation in a body while the strain is the deformation resulting from a stress. The organic polymer's modulus of elasticity is lower than either the modulus of elasticity of aluminum or silicon dioxide.

The volume of the organic polymer 106 at a $T_g$ of 400° C. expands much more rapidly than the volumes of the surrounding materials including silicon substrate 100, aluminum lines 102, and first dielectric layer 110 because organic polymer 106 has a lower $T_g$ and E and higher CTE than either silicon dioxide or aluminum. Further, considering that aluminum, and silicon dioxide have higher hardness numbers and modulus of elasticity than organic polymer, the surrounding materials included in interconnect system 2 are mechanically stronger than organic polymer 106 and thus are unlikely to deform during expansion at a predetermined $T_g$. The embodiment of the process of the present invention described herein relies in part on these unique properties of organic polymers in conjunction with the properties of materials such as aluminum and silicon dioxide described above to create voids (air gaps) within the organic polymer 106.

Figure 4:
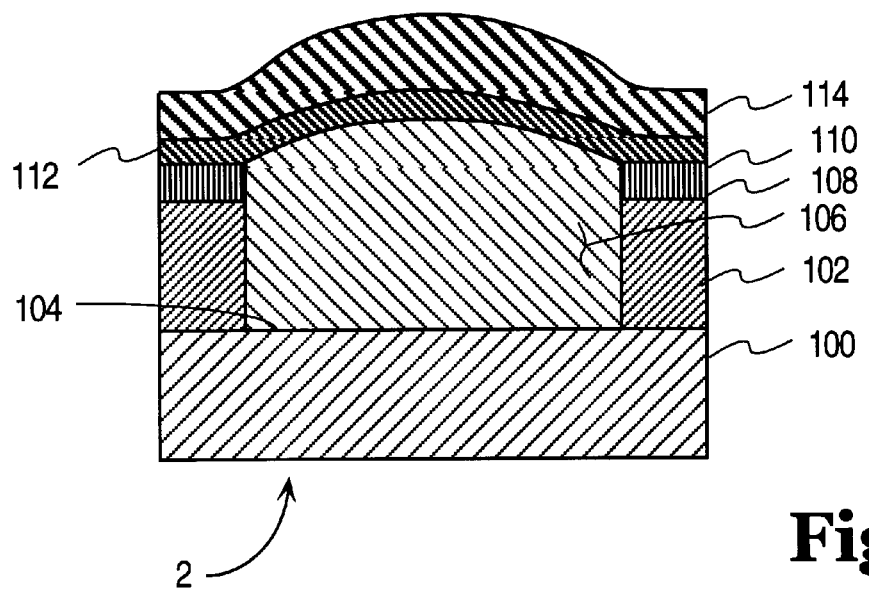
FIG. 4 shows a cross-sectional view of the interconnect system, according to one embodiment of the method of the present invention, where the organic polymer is expanded and a protective coating and a dielectric layer are deposited on top of the organic polymer.

FIG. 4 shows a cross-section through interconnect system 2 where organic polymer 106 is in expansion as a result of heating the interconnect system to the glass transition of temperature $T_g$ of the polymer which may be approximately 400° C. After the expansion of the polymer 106, protective coating 112 and a second dielectric layer 114 are deposited on top of organic polymer 106. In accordance with one embodiment of the present invention, protective coating 112 is deposited on top of organic polymer 106 by way of a Chemical Vapor Deposition (CVD) process for example. Protective coating 112 preferably includes an insulating material that is mechanically strong. Protective coating 112 protects organic polymer 106 against potential harm from chemical reactions occurring during subsequent processing. Protective coating 112 may protect organic polymer 106 from oxidation when interlayer dielectric 114 is subsequently deposited. To protect organic polymer 106, protective coating 112 is thick enough but thin enough to not affect the capacitance of second dielectric layer 114. Preferably, protective coating 112 has a thickness of approximately 300 Angstroms or less. Protective coating 112 is also used for providing adherence to a portion of organic polymer 106 that is in contact with protective coating 112. In one embodiment of the present invention, protective coating 112 includes silicon nitride or silicon carbide. Note that the protective coating 112, the material of which protective coating 112 is made and its thickness are functions of the organic polymer 106 and the subsequent fabrication process step(s) that may otherwise chemically attack organic polymer 106.

To provide greater mechanical strength to interconnect system 2, second dielectric layer 114 is deposited onto protective coating 112 by way of chemical vapor deposition. Second dielectric layer 114 is selected from materials that have thermal conductivities, mechanical strengths, and dielectric constants higher than those of organic polymer 106. Preferably, second dielectric layer 114 includes silicon dioxide. However, other materials having similar relevant properties may be substituted for silicon dioxide. The thickness of second dielectric layer 114 depends upon the specific implementation, but is typically in the range of 1 to 2 microns.

Figure 5:
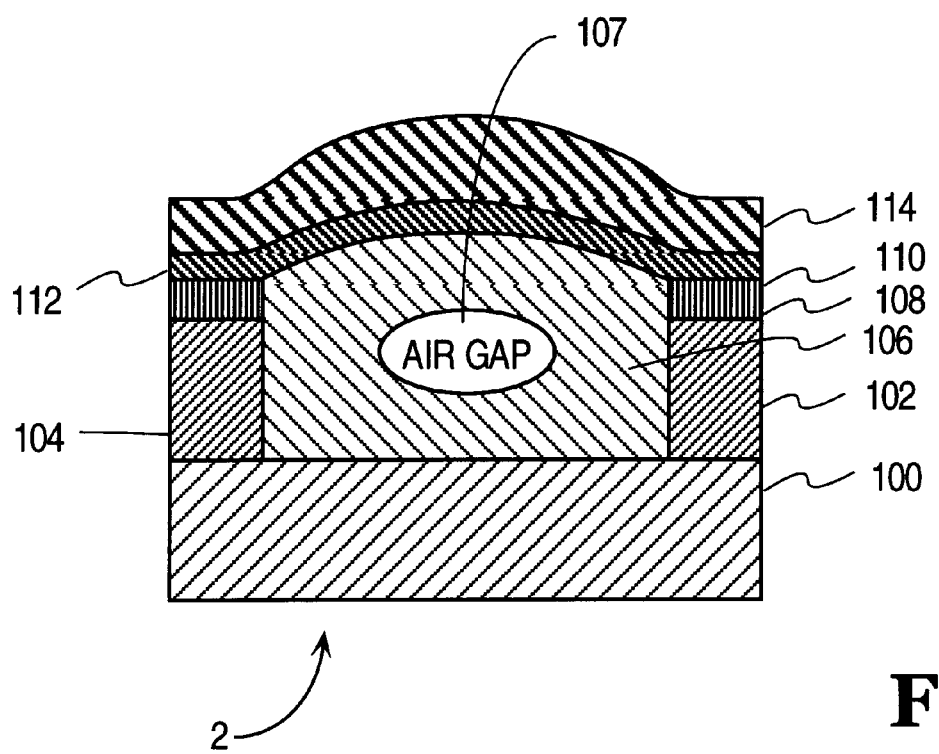
FIG. 5 shows a cross-sectional view of the interconnect system that has an air gap formed in the organic polymer.

FIG. 5 shows a cross-section of interconnect system 2 with an air gap 107 formed in organic polymer 106. The air gap 107 is formed when interconnect system 2 with organic polymer 106 are cooled from the $T_g$ down to room temperature. As interconnect system 2 is cooled down from a $T_g$ of 400° C., for instance, to room temperature, the volume of organic polymer 106 shrinks or contracts much more than the volumes of the surrounding materials including silicon substrate 100, aluminum lines 102, first dielectric layer 110, protective coating 112, and second dielectric layer 114. The volume contraction of organic polymer 106 is greater than the volume contractions of the surrounding materials because organic polymer 106 has a higher coefficient of thermal expansion and lower modulus of elasticity than silicon dioxide, silicon nitride or aluminum. Further, as aluminum, silicon dioxide, and silicon nitride have higher hardness numbers and moduli of elasticity than the organic polymer, the materials surrounding the organic polymer 106 of interconnect system 2 are mechanically stronger than organic polymer 106 and thus are unlikely to deform, or deform negligibly, compared to the organic polymer when the interconnect system is cooled down from $T_g$ to room temperature.

When the temperature of interconnect system 2 and organic polymer 106 decreases from $T_g$ to room temperature, adhesive forces between the surfaces of organic polymer 106 and the surfaces of the materials of interconnect system 2 surrounding the organic polymer 106 contribute to the formation of air gaps according to one embodiment of the process of the present invention. An adhesive force is a force capable of holding materials together by surface attachment. The adhesion force between any given two surfaces may be measured by adhesion testors such as stud pull testor or four point bending as a way of controlling adhesion. For proper formation of air gaps in the organic polymer 106 the adhesive forces between the surface of organic polymer 106 and the surfaces of the materials of interconnect system 2 surrounding the organic polymer need to exceed organic polymer 106's cohesive strength (the strength necessary to hold organic polymer 106 together as a result of polymer's intermolecular attractive forces). When the temperature decreases from $T_g$ and the adhesive forces between the surface of organic polymer 106 and the surfaces of the materials surrounding organic polymer 106 exceed organic polymer 106's cohesive strength, organic polymer 106 is said to be in "hydrostatic tension." Thus, upon contraction the adhesive forces described herein cause organic polymer 106 to "rip apart" and form voids therein. Once a void is formed, it will grow and continue to expand until the stress on organic polymer 106 subsides, e.g., until the adhesive forces between the surface of organic polymer 106 and the surfaces of the materials surrounding organic polymer 106 equal organic polymer 106's cohesive strength.

Unlike in the conventional way of forming air gaps by non-conformal interlayer dielectric (ILD) deposition which may expose the void to subsequent chemical processes and create reliability problems as discussed before, the embodiment of the process of the present invention avoids these reliability problems. Since the void is created only after protective coating 112 and second dielectric layer 114 are deposited, these layers shield the void from subsequent chemical processes so that foreign materials such as chemical solvents cannot be trapped in the void.

Figure 6:
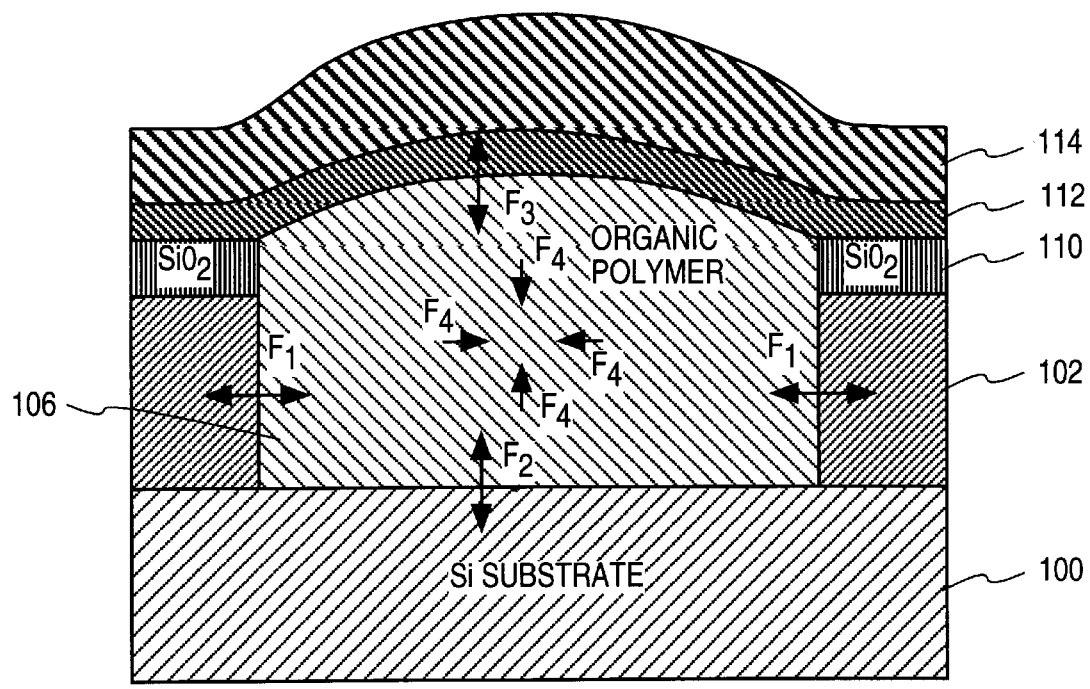
FIG. 6 shows various forces contributing to the formation of air gaps in one embodiment of the interconnect system according to the present invention.

FIG. 6 illustrates a cross-sectional view of interconnect system 2 with various adhesion forces interacting therebetweerl Thermal stress F0 (not shown) is the stress on interconnect system 2 and organic polymer 106 when they undergo a change in temperature. A fourth force F4, proportional to the organic polymer's cohesive strength, is the force necessary to hold organic polymer 106 together as a result of organic polymer 106's intermolecular attractive forces. F1, F2, and F3 represent the adhesive forces between the surface of organic polymer 106 and the surfaces of the Al metal lines, the Si substrate, and the SiN protective coating, respectively. Forces F1 and F2 are created when the organic polymer is formed onto the substrate, between the conductive lines. Force F3 is created when protective coating 112 is formed. If FX represents any of the adhesive forces F1, F2, and F3 and if F0>F4 and F4>FX, then the organic polymer may not adhere to the surface of the Al metal lines, to the surface of the Si substrate, and to the surface of the SiN protective coating. As a result, the organic polymer may delaminate, e.g., it may separate from the surfaces of the materials surrounding it However, if F0>F4 and FX>F4, then air gaps or voids will form. Therefore, to prevent delamination of organic polymer from materials surrounding it, it is good to have good adhesion between the surface of the organic polymer and the surfaces of the materials surrounding it.

Figure 7:
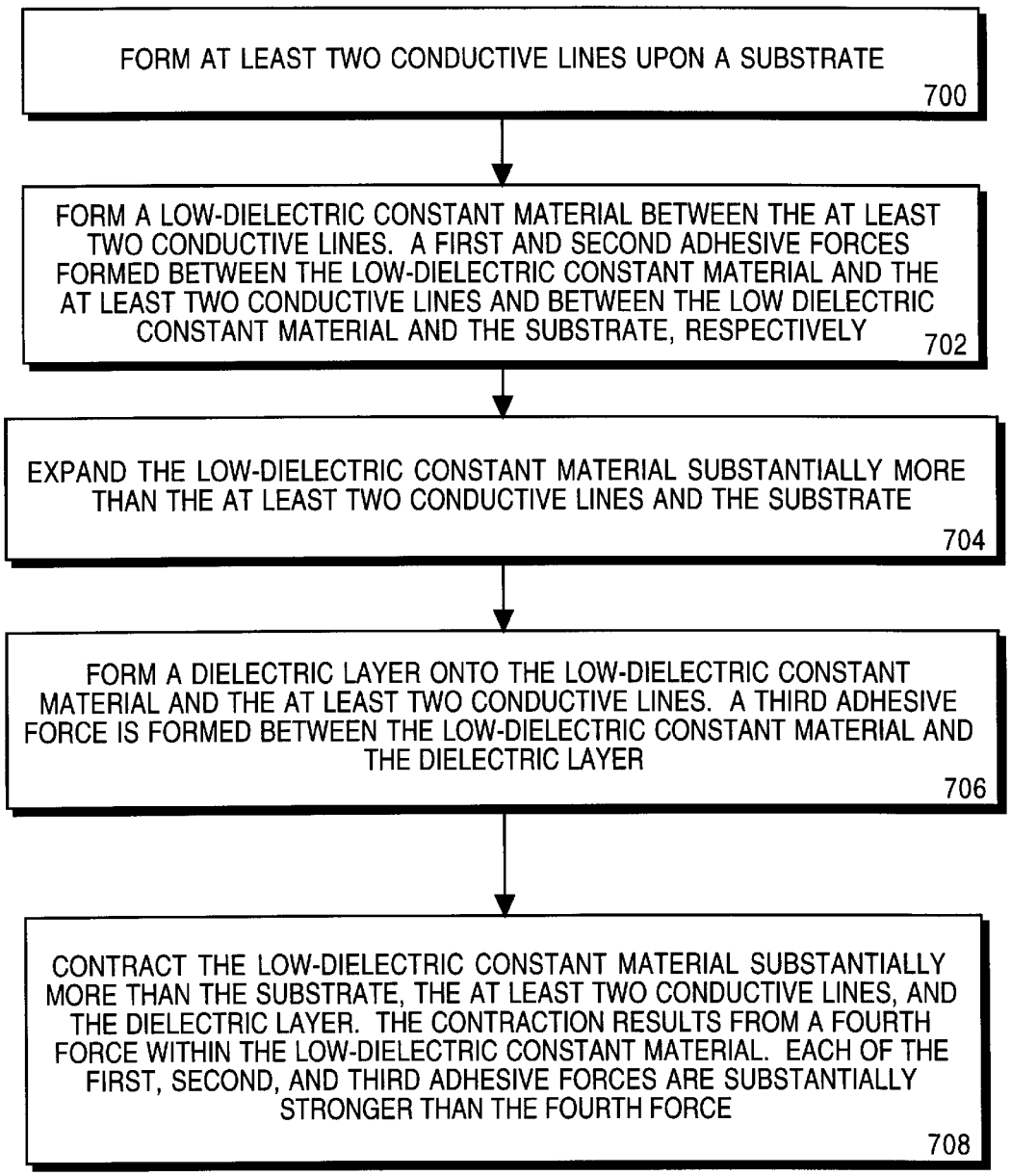
FIG. 7 is a flow chart diagram illustrating the steps of a method for forming air gaps in an interconnect system according to one embodiment of the present invention.

FIG. 7 illustrates a flow chart diagram in connection with one embodiment of the method of forming air gaps according to the present invention. The method starts at step 700 where at least two conductive lines are formed upon a substrate. At step 702, a low-ielectric constant material, such as an organic polymer, is formed between the at least two conductive lines. A first and second adhesive forces are formed between the low-dielectric constant material and the at least two conductive lines and between the low-dielectric constant material and the substrate, respectively. At step 704, the low-dielectric constant material is expanded substantially more than the at least two conductive lines and the substrate. In the embodiment of the method of the present invention described herein, the expansion of the low dielectric material is caused by heating the interconnect system. At step 706, a dielectric layer is formed onto the low-dielectric constant material and the at least two conductive lines. A third adhesive force thus is created between the low-dielectric constant material and the dielectric layer. At step 708, the low-dielectric constant material is contracted substantially more than the substrate, the at least two conductive lines, and the dielectric layer. The contraction results from a fourth force within the low-dielectric constant material. Each of the first, second, and third adhesive forces are substantially stronger than the fourth force.

In the foregoing specification, the invention has been described with reference to specific embodiments thereof. It will however be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. A process of forming air gaps in an interconnect system, the process comprising the steps of:

forming at least two conductive lines upon a substrate;

forming a low-dielectric constant material (LDCM) between said at least two conductive lines, formation of said LDCM creating first and second adhesive forces between said LDCM and said at least two conductive lines and between said LDCM and said substrate, respectively;

expanding said LDCM;

forming a dielectric layer onto said LDCM and said at least two conductive lines, formation of said dielectric layer creating a third adhesive force between said LDCM and said dielectric layer; and contracting said LDCM, contraction of said LDCM resulting from a fourth force within said LDCM, each of said first, second, and third adhesive forces substantially stronger than said fourth force.

2. The process of claim 1 wherein said expanding step includes heating.

3. The process of claim 2 wherein said LDCM, said substrate, and said at least two conductive lines are heated to a glass transition temperature ($T_g$) of said LDCM.

4. The process of claim 3 wherein said dielectric layer is formed at said glass transition temperature of said LDCM.

5. The process of claim 3 wherein said glass transition temperature of said LDCM is 400° C.

6. The process of claim 1 wherein said expanding step 1 causes said LDCM to expand substantially more than said at least two conductive lines and said substrate.

7. The process of claim 1 wherein said contracting step includes cooling said interconnect system.

8. The process of claim 1 wherein said contracting step causes said LDCM to contract substantially more than said substrate, said at least two conductive lines, and said dielectric layer.

9. The process of claim 5 wherein said LDCM, said substrate, said at least two conductive lines, and said dielectric layer are cooled to room temperature.

10. The process of claim 1 wherein said LDCM has a higher coefficient of thermal expansion and a lower glass transition temperature than said substrate, said at least two conductive lines, and said dielectric layer.

11. The process of claim 1, wherein after the step of forming at least two conductive lines upon a substrate, the process further comprising the step of forming an insulating layer onto said at least two conductive lines.

12. The process of claim 11 LDCM, further comprising the step of forming a protective coating onto said organic polymer and said insulating layer at said glass transition temperature of said LDCM.

13. The process of claim 1 wherein said at least two conductive lines include aluminum (Al).

14. The process of claim 1 wherein said low-dielectric constant material is an organic polymer.

15. The process of claim 1 wherein said dielectric layer includes silicon dioxide ($SiO_2$).

16. The process of claim 11 wherein said insulating layer includes silicon dioxide ($SiO_2$).

17. The process of claim 12 wherein said protective coating is selected from a group comprising silicon nitride and silicon carbide.

18. The process of claim 14 wherein said organic polymer includes a polyarylether.

19. The process of claim 14 wherein said organic polymer includes a high temperature aerogel.

20. The process of claim 14 wherein said organic polymer includes a silicon oxide glass.

* * * * *

UNITED STATES PATENT AND TRADEMARK OFFICE
CERTIFICATE OF CORRECTION

PATENT NO. : 6,037,249
DATED : March 14, 2000
INVENTOR(S) : Chiang et al.

Page 1 of 1

It is certified that error appears in the above-identified patent and that said Letters Patent is hereby corrected as shown below:

In column 2, at line 4, delete "dose" and insert --close--.

In column 3, at line 8, delete "indudes"and insert -- "includes --.

In column 4, at line 3, delete "f1ling" and insert -- filing--.

In column 6, at line 60 delete "therebetrl" and insert -- therebetween --.

In column 7, at line 22 delete "low-ielectric and insert-- low-dielectric --.

Signed and Sealed this

Fifth Day of June, 2001

Attest:

Attesting Officer

NICHOLAS P. GODICI

*Acting Director of the United States Patent and Trademark Office*